United States Patent
Parthasarathy et al.

(10) Patent No.: US 12,063,019 B2
(45) Date of Patent: Aug. 13, 2024

(54) INTEGRATED CIRCUIT DEVICES WITH RECEIVER CHAIN PEAK DETECTORS

(71) Applicant: Texas Instruments Incorporated, Dallas, TX (US)

(72) Inventors: Harikrishna Parthasarathy, Bangalore (IN); Arnab Das, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/487,573

(22) Filed: Oct. 16, 2023

(65) Prior Publication Data

US 2024/0056047 A1 Feb. 15, 2024

Related U.S. Application Data

(60) Continuation of application No. 17/465,243, filed on Sep. 2, 2021, now Pat. No. 11,824,508, which is a division of application No. 16/575,132, filed on Sep. 18, 2019, now Pat. No. 11,139,791.

(51) Int. Cl.
*H03G 3/30* (2006.01)

(52) U.S. Cl.
CPC .................. *H03G 3/3057* (2013.01)

(58) Field of Classification Search
CPC ...... H03F 3/19; H03G 3/3052; H03G 3/3057; H03G 3/3068
See application file for complete search history.

(56) References Cited

U.S. PATENT DOCUMENTS

| | | | |
|---|---|---|---|
| 4,667,165 A | 5/1987 | de Weck | |
| 7,126,424 B2 | 10/2006 | Klein | |
| 7,200,372 B2 | 4/2007 | Carpineto | |
| 7,212,798 B1 | 5/2007 | Adams | |
| 8,045,941 B2 | 10/2011 | Muhammad | |
| 8,180,308 B1 | 5/2012 | Neng | |
| 9,008,157 B2 | 4/2015 | Muhammad | |
| 9,166,541 B2 | 10/2015 | Funato | |
| 9,166,852 B2 | 10/2015 | Davierwalla | |
| 9,756,572 B2 | 9/2017 | Murali | |
| 2003/0025623 A1 | 2/2003 | Brueske | |
| 2003/0078007 A1 | 4/2003 | Parssinen | |
| 2004/0152429 A1* | 8/2004 | Haub | H04B 1/1027 455/116 |

(Continued)

*Primary Examiner* — Nguyen T Vo
(74) *Attorney, Agent, or Firm* — Mandy Barsilai Fernandez; Frank D. Cimino

(57) ABSTRACT

An integrated circuit device is provided. In some examples, the integrated circuit device includes an amplifier stage that receives an input signal and a control signal and provides an amplified signal in response. A main path is coupled to the amplifier stage that receives the amplified signal and provides a first feedback signal corresponding to a signal strength of a data-bearing portion of the input signal. A control path also receives the amplified signal and provides a second feedback signal corresponding to a signal strength of the data-bearing portion and an interference component. A gain control circuit is coupled to the main path and the control path that receives the first and second feedback signals and provides the control signal in response to the feedback signals. In some such examples, the control path and main path include separate mixer stages with different performance characteristics.

20 Claims, 5 Drawing Sheets

(56) References Cited

U.S. PATENT DOCUMENTS

| | | |
|---|---|---|
| 2006/0091948 A1 | 5/2006 | Darabi |
| 2007/0110193 A1 | 5/2007 | Solum |
| 2007/0293177 A1 | 12/2007 | Li |
| 2010/0022211 A1* | 1/2010 | Huang .................. H04W 52/52 |
| | | 455/232.1 |
| 2012/0034894 A1 | 2/2012 | Chan |
| 2012/0294398 A1* | 11/2012 | Yucek .................. H03G 3/3052 |
| | | 375/345 |
| 2012/0329415 A1 | 12/2012 | De Ruijter |
| 2013/0044842 A1 | 2/2013 | Wang |
| 2014/0065995 A1 | 3/2014 | Moiraghi |
| 2017/0346461 A1 | 11/2017 | Corbishley |
| 2020/0351577 A1 | 11/2020 | Valencia |

* cited by examiner

INTEGRATED CIRCUIT DEVICES WITH RECEIVER CHAIN PEAK DETECTORS

This is a continuation of U.S. patent application Ser. No. 17/465,243, filed Sep. 2, 2021, which is a divisional of U.S. patent application Ser. No. 16/575,132, filed Sep. 18, 2019, now U.S. Pat. No. 11,139,791, which applications are hereby incorporated herein by reference.

BACKGROUND

A receiver of a communication device, such as a wireless transceiver, may include a set of signal processing stages arranged in a receiver chain. These stages may include one or more amplifier stages. To improve reception of weaker signals, the combined gain of the amplifier stages may be relatively high. However, applying large gains to stronger signals may saturate the amplified signal, leading to distortion (e.g., clipping) in the amplified signal that may make extracting data from the signal more difficult. In extreme cases, the data may be lost entirely. Accordingly, some receivers use automatic gain control (AGC) regulation to dynamically control the gain based on the signal strength.

In many applications, receivers receive interference along with the data-bearing portion of the signal. While later stages may filter the interference, stages prior to the filter stages may be subject to the interference components of the signal. When amplifying the signal, both the interference and the data-bearing portion may contribute to the saturation of the amplified signal.

SUMMARY

In some examples, an integrated circuit is provided that includes a receiver chain for a wireless receiver. The receiver chain includes amplifier stages, mixer stages, filter stages, and/or other suitable stages. Properties of these stages, including gain, may be controlled by an automatic gain control (AGC) circuit that receives feedback of the signal strength from the various stages and adjusts the properties of the stages accordingly. Various stages in the receiver stages may filter interference and preserve the data-bearing portion of the signal, and so the feedback from these stages may not measure the interference components. Because the interference may contribute to signal saturation, particularly in stages of the receiver chain prior to the filter stages, the receiver chain may include a separate control path running in parallel that preserves the interference for use in AGC determinations.

In some examples, an integrated circuit device includes an amplifier stage that receives an input signal and a control signal and provides an amplified signal in response to the input signal and the control signal. A main path is coupled to the amplifier stage that receives the amplified signal and provides a first feedback signal corresponding to a signal strength of a data-bearing portion of the input signal. A control path is coupled to the amplifier stage that receives the amplified signal and provides a second feedback signal corresponding to a signal strength of the data-bearing portion and an interference component of the input signal. A gain control circuit is coupled to the main path and the control path that receives the first feedback signal and the second feedback signal and provides the control signal in response to the first feedback signal and the second feedback signal.

In some examples, an integrated circuit includes an amplifier with a first input, a control input, and an output. A first path is coupled to the amplifier that includes an output and a first mixer stage coupled to the output of the amplifier. A second path is coupled to the amplifier that includes an output and a second mixer stage coupled to the output of the amplifier. The integrated circuit also includes a control circuit with a first input coupled to the output of the first mixer stage, a second input coupled to the output of the second mixer stage, and an output coupled to the control input of the amplifier.

In some examples, a method includes receiving an input signal, and amplifying the input signal according to a gain control signal to produce an amplified signal. A first baseband conversion is performed on the amplified signal to produce a first intermediate frequency signal, and a first feedback signal is determined based on the first intermediate frequency signal that corresponds to a signal strength of a data-bearing portion of the input signal. A second baseband conversion is performed on the amplified signal to produce a second intermediate frequency signal, and a second feedback signal is determined based on the second intermediate frequency signal that corresponds to a signal strength of the data-bearing portion and an interference component of the input signal. The gain control signal is modified based on the first feedback signal and the second feedback signal.

BRIEF DESCRIPTION OF THE DRAWINGS

Features of the present invention may be understood from the following detailed description and the accompanying drawings.

DETAILED DESCRIPTION

Figure 1A:
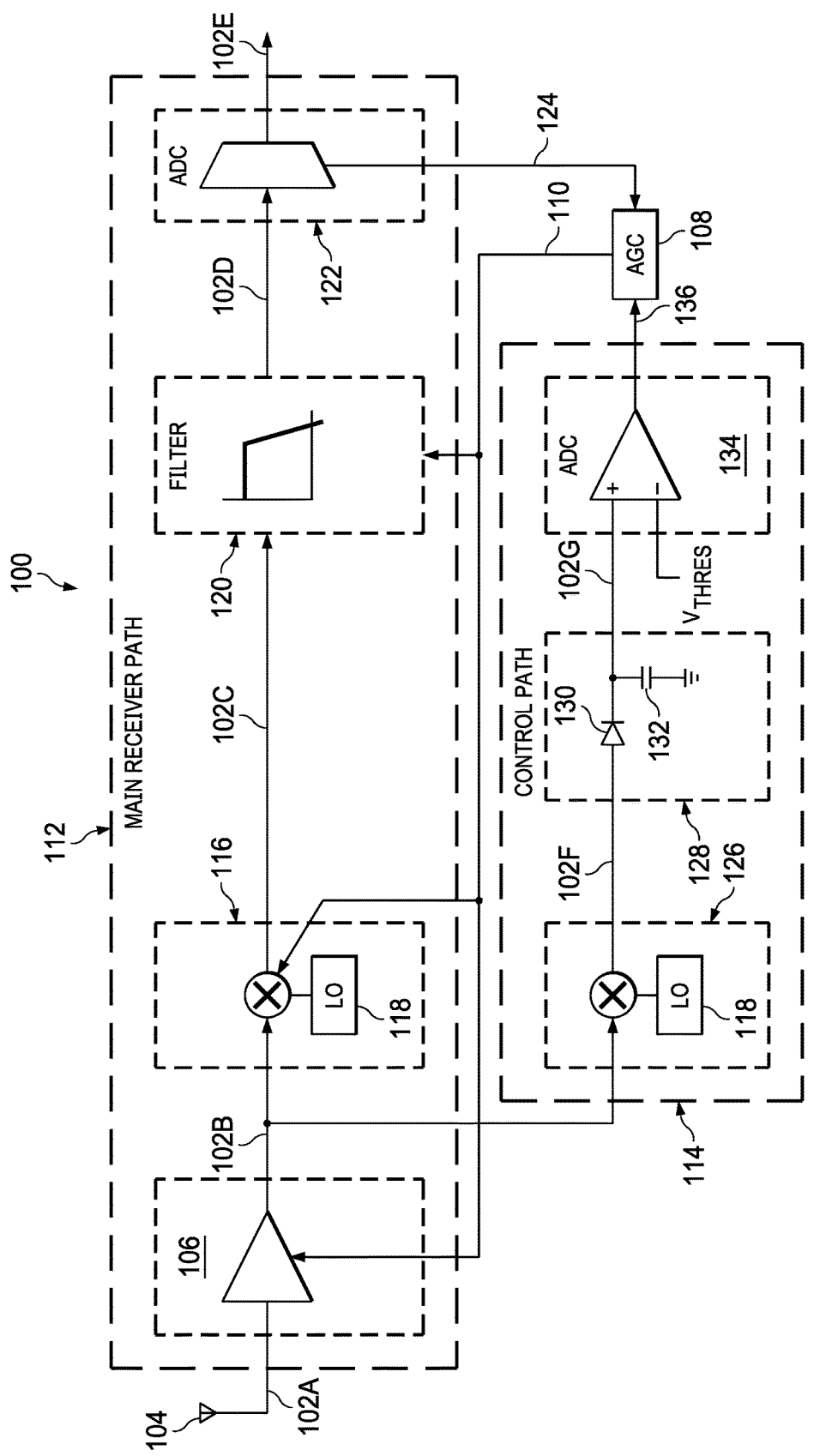
FIGS. 1A and 1B are circuit diagrams of a receiver chain according to some aspects of the present disclosure.

Specific examples are described below in detail with reference to the accompanying figures. It is understood that these examples are not intended to be limiting, and unless otherwise noted, no feature is required for any particular example. Moreover, a first device that is coupled (electrically, physically, or otherwise) to a second device may be coupled directly without any intervening device or indirectly through one or more intervening devices.

An example receiver includes a receiver chain with a number of analog and digital stages that process a received signal to extract data from the signal. These stages may include one or more amplifier stages that amplify the received signal. The maximum combined gain of the receiver chain may be relatively high (e.g., about 60 dB in some examples) so that data can be extracted from weaker signals. However, applying the maximum gain to a stronger signal may saturate the amplified signal, which may cause clipping and other types of distortion. Accordingly, the example receiver includes an automatic gain control (AGC) circuit that adjusts the operation of one or more stages in the receiver chain to decrease gain when the signal is relatively strong and increase gain when the signal is relatively weak.

In some examples, the AGC circuit receives a first feedback signal that corresponds to signal strength from an analog-to-digital converter (ADC) of the receiver chain.

Because the receiver chain may have filtered out interference from the signal before it reached the ADC, the first feedback signal may correspond primarily to the strength of the data-bearing portion of the signal. However, both the data-bearing portion and interference in the signal may contribute to signal saturation. Accordingly, the example AGC also receives a second feedback signal that corresponds to signal strength of both the data-bearing portion and the interference. This second feedback signal may be provided by a parallel control path in the receiver chain that includes stages such as a baseband down-conversion mixer, a peak detector, and/or an ADC. The stages of the control path may be specifically configured to preserve and even amplify the interference.

By considering the interference as well as the data-bearing portion of the signal, the AGC may more aggressively increase gain in low- and moderate-interference situations. In some such examples, the receiver is able use the increased amplification to detect received signals having 40 dB less power than comparable designs.

In some examples, the control path includes a baseband down-conversion mixer with wide bandwidth to preserve interference that also amplifies the signal being down-converted to increase sensitivity to the interference components of the signal. In some such examples, the baseband down-conversion mixer provides this amplification without inductors, which tend to have a large layout footprint. The baseband down-conversion mixer allows peak detection of the signal to be performed in the intermediate frequency domain (e.g., baseband domain) rather than the radio frequency domain, which may allow for simpler peak detector circuitry because the frequencies are lower and the range of frequencies of interest is smaller in the intermediate frequency domain. In these examples and others, the receiver demonstrates greater signal sensitivity using the same or reduced power and area despite the addition of the control path stages.

Of course, these advantages are merely examples, and no advantage is required for any particular embodiment.

Examples of an integrated circuit device with a receiver chain are described with reference to the figures below. In that regard, FIG. 1A is a circuit diagram of a receiver chain 100 of a receiver according to some aspects of the present disclosure.

The receiver chain 100 may be part of a wireless transceiver and may receive an input signal 102A via an antenna 104. In further embodiments, the receiver chain 100 is part of a wired transceiver (e.g., optical transceiver, Ethernet transceiver) and receives the input signal 102A via a receiver element such as a photodiode or via a direct electrical connection with a transmitter.

The input signal 102A may be a differential or single-ended signal and may include a data-bearing portion occurring at one or more specified frequencies or frequency ranges. The input signal 102A may also include interference components at other frequencies. These interference components may include data-bearing emissions intended for other receivers and/or general background noise. Interference components near in frequency to the data-bearing portion may be referred to as interferers or blockers.

The receiver chain 100 may include two parallel signal paths of the receiver chain, a main receiver path 112 and a control path 114. The main receiver path 112 may process the received signal to extract data from the data-bearing portion. This may include filtering by one or more stages to remove interference and extract the data-bearing portion. In contrast, the control path 114 may preserve at least some portion of the interference for use in setting the gain and/or other operating parameters of the stages of the main receiver path 112.

The main receiver path 112 is described first, and includes an amplifier stage 106 coupled to the antenna 104. The input signal 102A, including the data-bearing portion and any interference, is received by an input of the amplifier stage 106. The amplifier stage 106 may include any suitable amplifier circuits, and in some examples, the amplifier stage 106 includes a low-noise amplifier (LNA) or similar amplifier. The amplifier stage 106 amplifies the input signal 102A according to a set of operating parameters (e.g., a gain value, a frequency response curve, and/or other operating parameters) provided by an AGC circuit 108 via a set of AGC control signals 110 at control inputs of the amplifier stage 106. The amplifier stage 106 provides the amplified input signal 102A as amplified signal 102B. The amplifier stage 106 may be configured to remove some of the interference from the input signal 102A through filtering or control of the amplifier's frequency response curve. However, significant interference, particularly in frequencies around the frequency of the data-bearing portion of the signal, may be present in the amplified signal 102B.

The amplifier stage 106 may provide the amplified signal 102B to the rest of the main receiver path 112 as well as the control path 114. In the main receiver path 112, a first mixer stage 116 coupled to the amplifier stage 106 receives the radio-frequency amplified signal 102B and converts it into a first intermediate frequency signal 102C. The first mixer stage 116 may include a baseband down-conversion mixer that mixes the radio-frequency amplified signal 102B with a fixed-amplitude signal (e.g., a square wave signal, a sinusoidal signal, etc.) at a carrier frequency produced by a local oscillator (LO) 118. The first mixer stage 116 may also include baseband filters (e.g., low-pass filters) coupled to the down-conversion mixer that remove aliases from the output signal of the down-conversion mixer to produce the first intermediate frequency signal 102C. Operating parameters of the first mixer stage 116, such as the gain, the frequency response curve(s), and/or other parameters, may be controlled by the AGC control signals 110 of the AGC circuit 108, which are received at control inputs of the mixer stage 116.

The down-mixing and the filtering of the first mixer stage 116 may remove some of the interference from the first intermediate frequency signal 102C, and to the extent that any interference remains, the main receiver path 112 may include one or more filter stages 120 coupled to the first mixer stage 116 that receive the first intermediate frequency signal 102C from the first mixer stage 116 and produce filtered signal 102D. Operating parameters of the filter stages 120 including the frequency response curve(s) may be controlled by the AGC control signals 110 of the AGC circuit 108, which are received at control inputs of the filter stages 120.

The main receiver path 112 includes a first analog-to-digital converter (ADC) stage 122 coupled to the filter stages 120 to receive the filtered signal 102D from the filter stages 120. The first ADC stage 122 may convert voltages of the filtered signal 102D into a digital representation of the filtered signal 102D to produce a digital output signal 102E. The digital output signal 102E may be provided to a remainder of the receiver for further signal processing including extracting data encoded in the digital output signal 102E.

The ADC stage 122 may also provide a first feedback signal 124 to an input of the AGC circuit 108. The first feedback signal 124 corresponds to the signal strength of the filtered signal 102D and/or digital output signal 102E, and thus corresponds to the signal strength of the data-bearing portion of the received input signal 102A. In some examples, the first feedback signal 124 corresponds to a peak value of the data-bearing portion of the input signal 102A within an interval of time. In some examples, the first feedback signal 124 corresponds to an average of the data-bearing portion of the input signal 102A over an interval of time. In further examples, the first feedback signal 124 includes other representations of signal strength.

The AGC circuit 108 uses the first feedback signal 124 to provide operating parameters to stages of the main receiver path 112, such as the amplifier stage 106, the first mixer stage 116, the filter stage 120, etc., via the AGC control signals 110. For example, the AGC circuit 108 may increase the gain of these stages when the first feedback signal 124 indicates that the signal strength is low, and decrease the gain of these stages when the first feedback signal 124 indicates that the signal strength is high.

Elements of the main receiver path 112, such as the filter stage 120, may remove most or all of the interference from the filtered signal 102D prior to reaching the first ADC stage 122. Accordingly, the first feedback signal 124, which is based on the filtered signal 102D, may represent primarily the data-bearing portion of the input signal 102A without the interference. So that the AGC circuit 108 may also consider the interference component, the control path 114 may be configured to process the received signal (e.g., amplified signal 102B) in a manner that preserves at least a portion of the interference.

In some examples, the control path 114 includes a second mixer stage 126 coupled to the amplifier stage 106 in parallel with the first mixer stage 116. Similar to the first mixer stage 116, the second mixer stage 126 receives the amplified signal 102B and may include a baseband down-conversion mixer that mixes the radio-frequency amplified signal 102B with a signal at the carrier frequency produced by an LO 118. The second mixer stage 126 may also include baseband filters (e.g., low-pass filters) coupled to the down-conversion mixer that filter the output signal of the down-conversion mixer to produce a second intermediate frequency signal 102F.

In contrast to the first mixer stage 116, the filters and/or down-conversion mixer of the second mixer stage 126 may be configured to have a wider bandwidth so that interference components that are absent or reduced in signal 102C are present in the second intermediate frequency signal 102F. In some examples, the second mixer stage 126 has a bandwidth of about 300 MHz. The second mixer stage 126 may also have greater amplification than the first mixer stage 116 to increase the sensitivity to the interference components. In some such examples, the second mixer stage 126 has a gain of about 16 dB, although any suitable gain may be used. In some examples, such as those described in subsequent figures, the second mixer stage 126 achieves this gain without the use of inductors, which may otherwise consume a significant amount of circuit area.

The control path 114 further includes a peak detector 128 coupled to the second mixer stage 126 to receive the second intermediate frequency signal 102F. The peak detector 128 may produce a peak signal 102G with a voltage representing a peak voltage of the second intermediate frequency signal 102F over a window of time. In an example, the peak detector 128 includes a diode 130 with an input coupled to receive signal 102F and an output coupled to produce signal 102G and a capacitor 132 coupled between the output of the diode 130 and ground. Further examples of the peak detector 128 are described in more detail below.

Arranging the peak detector 128 after the second mixer stage 126 may simplify the structure of the peak detector 128 because of the baseband conversion. In some examples, because the relevant frequencies are lower in the intermediate frequency domain, the high-frequency response of the peak detector 128 becomes less relevant, and in turn, the complexity and sensitivity of peak detector 128 may be reduced. Similarly, in some examples, because the range of relevant frequencies is smaller in the intermediate frequency domain, the complexity and sensitivity of peak detector 128 may be further reduced. The peak detector 128 may also benefit from the amplification provided by the second mixer stage 126 and/or the amplifier stage 106, which may amplify the interference and allow detection even if sensitivity of the peak detector 128 is reduced.

A second ADC stage 134 is coupled to the peak detector 128 and receives the peak signal 102G. The second ADC stage 134 produces a second feedback signal 136 with a digital value representing voltage of the peak signal 102G relative to a threshold voltage $V_{Thres}$. In this way, the second feedback signal 136 has a voltage proportional to the strength of the data-bearing portion and the interference components of the input signal 102A. As with the first feedback signal 124, the second feedback signal 136 may correspond to a peak measurement, an average measurement, and/or any other suitable measurement of signal strength.

The AGC circuit 108 is coupled to the second ADC stage 134 and receives the second feedback signal 136 from the second ADC stage 134. Accordingly, the AGC circuit 108 considers both the first feedback signal 124 and the second feedback signal 136 when determining the operating parameters (e.g., gain settings, frequency responses, and/or other operating parameters) of the stages of the main receiver path 112 (e.g., the amplifier stage 106, the first mixer stage 116, the filter stage 120, etc.) provided via the AGC control signals 110.

In an example, the AGC circuit 108 increases the gain of the stages of the main receiver path 112 when the first feedback signal 124 indicates the signal strength of the data-bearing portion of the input signal 102A is low, and decreases the gain when the first feedback signal 124 indicates that the signal strength of the data-bearing portion is high. The example AGC circuit 108 limits the maximum gain of the stages of the main receiver path 112 based on the second feedback signal 136 so that the signal strength of the combined interference and data-bearing portion represented by the second feedback signal 136 will not cause signal saturation. In particular, the AGC circuit 108 may apply a greater gain to low- or medium-noise signals than otherwise possible because the amount of interference is determined and considered instead of using a conservative interference guardband. In turn, this greater amplification may allow the receiver chain 100 to successfully extract data from weaker signals.

Figure 1B:
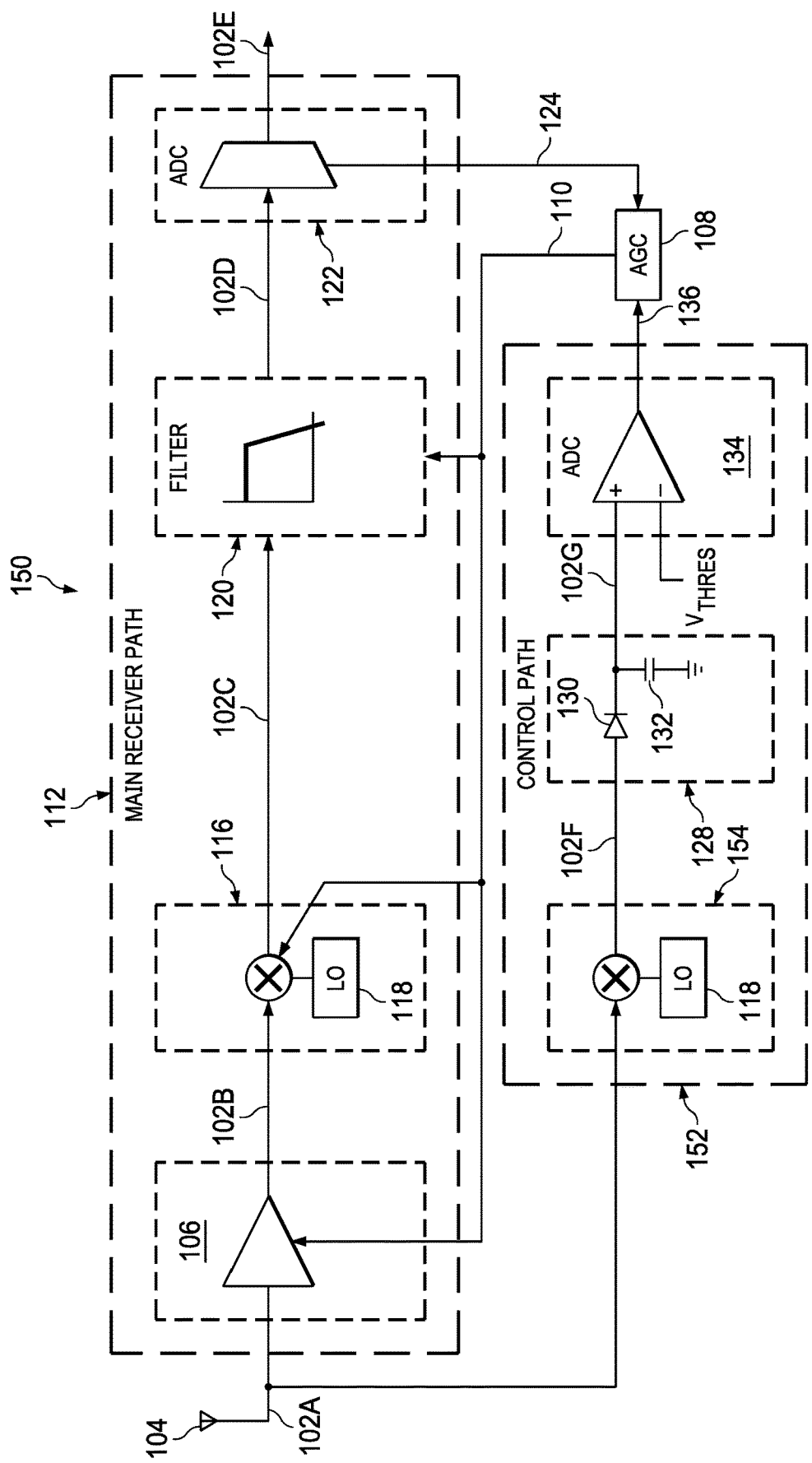

Further examples of a receiver chain 150 are described with reference to FIG. 1B, which is a circuit diagram of a receiver chain 150 of a receiver according to some aspects of the present disclosure. In many aspects, the receiver chain 150 is substantially similar to receiver chain 100. For example, the receiver chain 150 includes a main receiver path 112 that includes an amplifier stage 106, a first mixer stage 116, filter stages 120, and a first ADC stage 122 similar to those of FIG. 1A. The receiver chain 150 also includes an AGC circuit 108 substantially similar to that of FIG. 1A.

In contrast, the control path 152 of the receiver chain 150 receives the input signal 102A from the antenna 104 directly rather than receiving the amplified signal 102B. Otherwise, operation of the control path 152 is similar. The control path 152 includes a second mixer stage 154 that is coupled to the antenna 104 and receives the input signal 102A. Similar to second mixer stage 126, second mixer stage 154 may include a baseband down-conversion mixer that mixes the radio-frequency input signal 102A with a signal at the carrier frequency produced by an LO 118. The second mixer stage 154 may also include baseband filters (e.g., low-pass filters) coupled to the down-conversion mixer that filter the output signal of the down-conversion mixer to produce a second intermediate frequency signal 102F.

The filters and/or downmixer of the second mixer stage 154 may be configured to have a wider bandwidth than the first mixer stage 116, so that interference components that are absent or reduced in signal 102C are present in the second intermediate frequency signal 102F.

The control path 114 further includes a peak detector 128 (including a diode 130 and a capacitor 132) and a second ADC stage 134 that produces a second feedback signal 136 substantially as described above.

Figure 2:
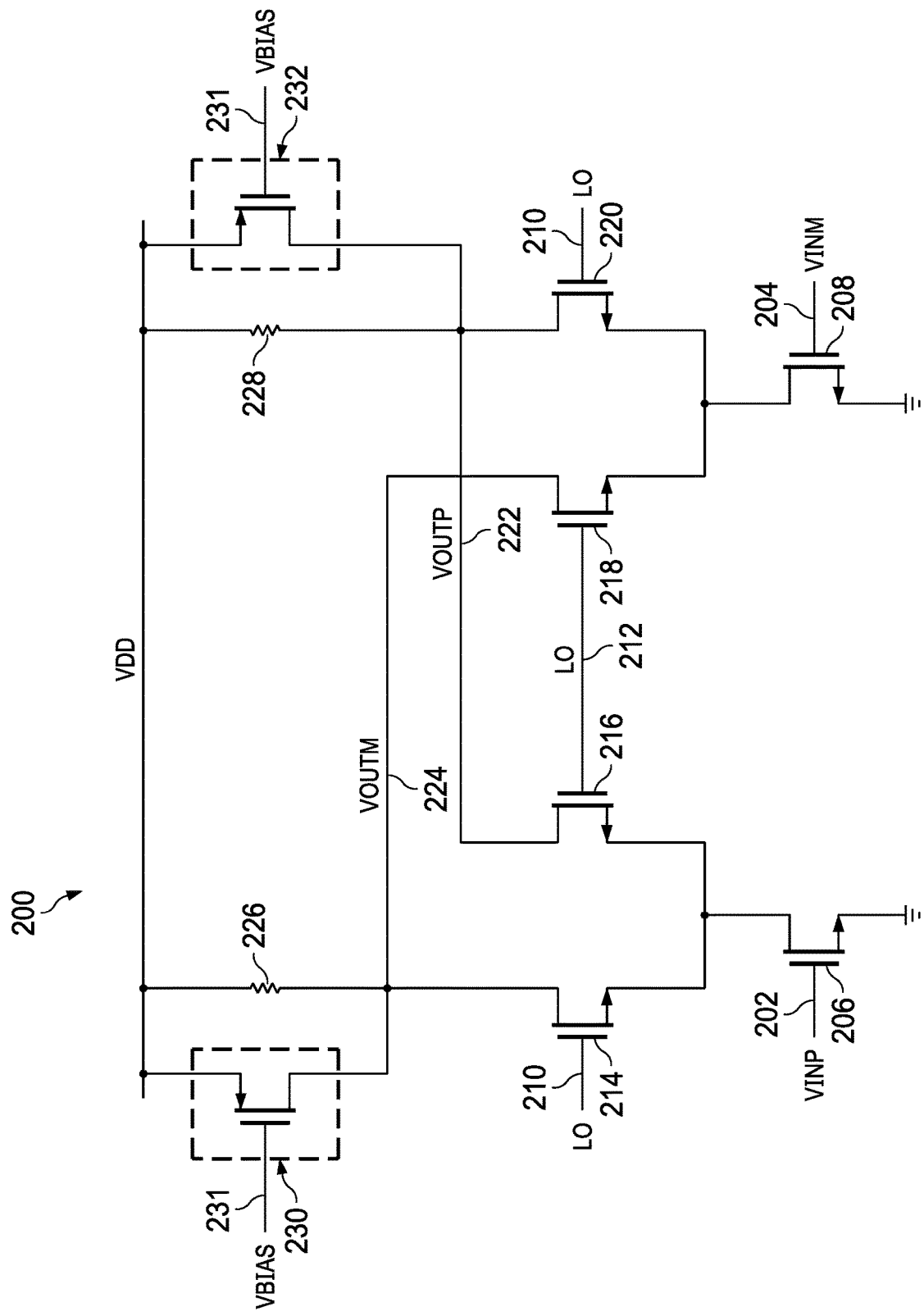
FIG. 2 is a circuit diagram of a mixer stage according to some aspects of the present disclosure.

Examples of a mixer stage suitable for use in the second mixer stage 126 and/or 154 of the control path 114 are described with reference to FIG. 2. In that regard, FIG. 2 is a circuit diagram of a mixer stage 200 according to some aspects of the present disclosure.

The mixer stage 200 is configured to receive an input signal (e.g., amplified signal 102B) as a differential pair of signals $V_{inP}$ 202 and $V_{inM}$ 204. Signal $V_{inP}$ 202 is coupled to a gate of a first transistor 206, and signal $V_{inM}$ 204 is coupled to a gate of a second transistor 208.

The mixer stage 200 is also configured to receive a signal (e.g., a square wave signal, a sinusoidal signal, etc.) at a carrier frequency from an LO 118 as a differential pair of signals LO 210 and 212. Signal LO 210 is coupled to a gate of a third transistor 214. Signal $\overline{LO}$ 212 is coupled to a gate of a fourth transistor 216 and a gate of a fifth transistor 218. Signal LO 210 is also coupled to a gate of a sixth transistor 220.\x \to(LO)

The source of the first transistor 206 is coupled to a ground node, and the drain of the first transistor 206 is coupled to sources of the third transistor 214 and the fourth transistor 216. Similarly, the source of the second transistor 208 is coupled to the ground node, and the drain of the second transistor 208 is coupled to sources of the fifth transistor 218 and the sixth transistor 220.

The mixer stage 200 is configured to produce an intermediate frequency signal (e.g., second intermediate frequency signal 102F) as a differential pair of signals $V_{outP}$ 222 and $V_{outM}$ 224. The $V_{outM}$ node 224 is coupled to drains of the third transistor 214 and the fifth transistor 218, and a first resistor 226 is coupled between a voltage source and the $V_{outM}$ node 224. The $V_{outP}$ node 222 is coupled to drains of the fourth transistor 216 and the sixth transistor 220, and a second resistor 228 is coupled between the voltage source and the $V_{outP}$ node 222.

In some examples, the mixer stage 200 includes current helper transistors 230 and 232 coupled in parallel with the first resistor 226 and the second resistor 228, respectively. In some such examples, sources of the first current helper transistor 230 and the second current helper transistor 232 are coupled to the voltage source, and gates of the first current helper transistor 230 and the second current helper transistor 232 are coupled to a bias voltage $V_{Bias}$ 231. A drain of the first current helper transistor 230 is coupled to the $V_{outM}$ node 224, and a drain of the second current helper transistor 232 is coupled to the $V_{outP}$ node 222.

Mixer stage 200 is merely one example of a suitable circuit for the second mixer stages 126 and 154, and other suitable circuits are contemplated and provided for.

Figure 3:
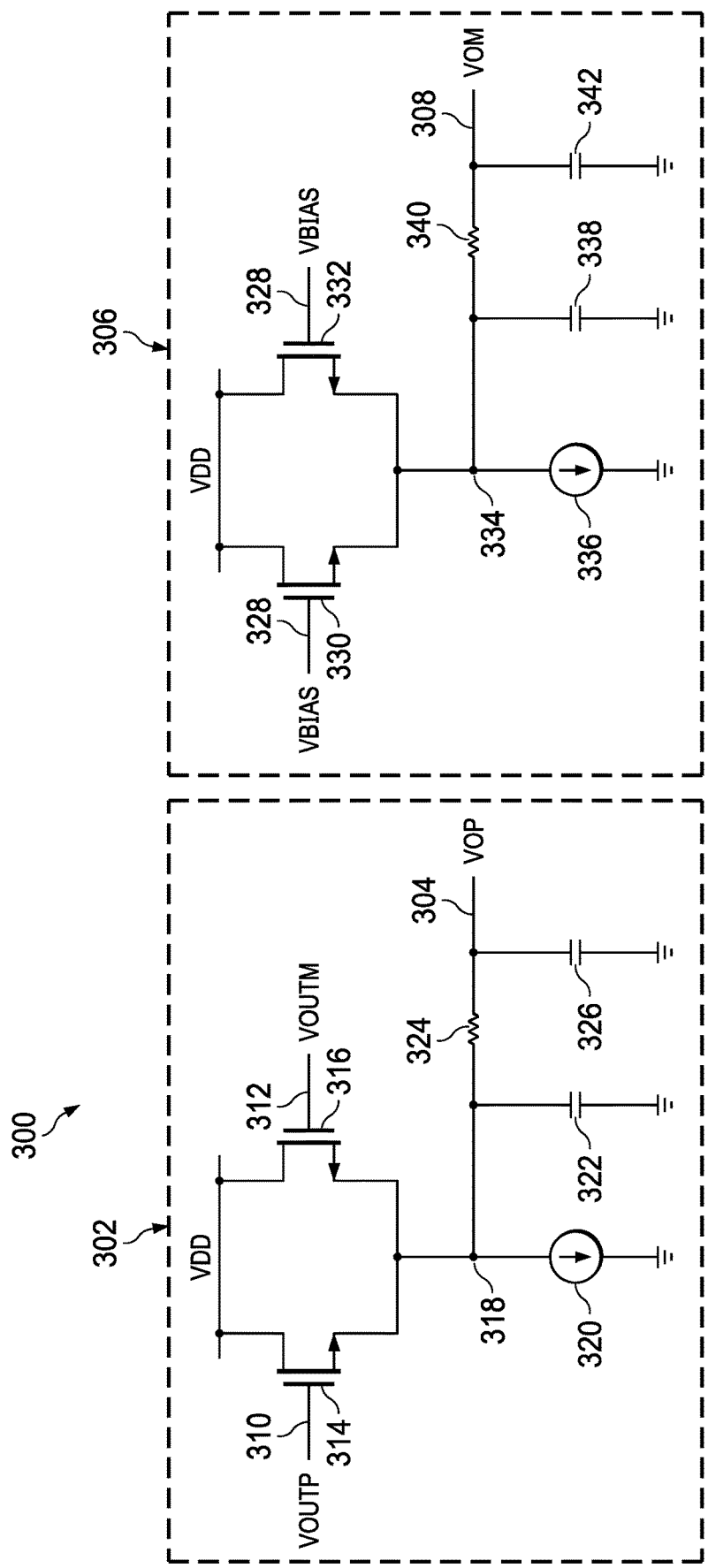
FIG. 3 is a circuit diagram of a peak detector according to some aspects of the present disclosure.

Examples of a peak detector 300 suitable for use in the peak detector 128 of the control path 114 are described with reference to FIG. 3. In that regard, FIG. 3 is a circuit diagram of a peak detector 300 according to some aspects of the present disclosure.

In some examples, the peak detector 300 is configured to operate on a differential signal pair and includes a main peak detector subunit 302 to produce a first signal of the differential signal pair ($V_{oP}$, 304) and a replica peak detector subunit 306 to produce a second signal of the differential signal pair ($V_{oM}$ 308).

The main peak detector subunit 302 may receive an input signal (e.g., second intermediate frequency signal 102F) as a differential pair of signals $V_{outP}$ 310 and $V_{outM}$ 312. Signal $V_{outP}$ 310 is coupled to a gate of a first transistor 314, and signal $V_{outM}$ 312 is coupled to a gate of a second transistor 316. The drains of the first transistor 314 and the second transistor 316 are coupled to a voltage source, and the sources of the first transistor 314 and the second transistor 316 are coupled to a first node 318.

The main peak detector subunit 302 includes a first current source 320 and a first capacitor 322 coupled in parallel between the first node 318 and a ground node. A first resistor 324 is coupled between the first node 318 and a node associated with the first output signal, $V_{oP}$ 304. A second capacitor 326 is coupled between the $V_{oP}$ node 304 and the ground node.

The replica peak detector subunit 306 is similar to the main peak detector subunit 302 and may be used to correct a DC offset. The main peak detector subunit 302 is configured to receive a common mode voltage $V_{Bias}$ 328 that is provided to a gate of a third transistor 330 and a gate of a fourth transistor 332. The drains of the third transistor 330 and the fourth transistor 332 are coupled to the voltage source, and the sources of the third transistor 330 and the fourth transistor 332 are coupled to a second node 334.

The replica peak detector subunit 306 includes a second current source 336 and a third capacitor 338 coupled in parallel between the second node 334 and the ground node. A second resistor 340 is coupled between the second node 334 and a node associated with the second output signal, $V_{oM}$ 308. A fourth capacitor 342 is coupled between the node associated with Van 308 and the ground node.

Peak detector 300 is merely one example of a suitable circuit for the peak detector 128, and other suitable circuits are contemplated and provided for.

Figure 4:
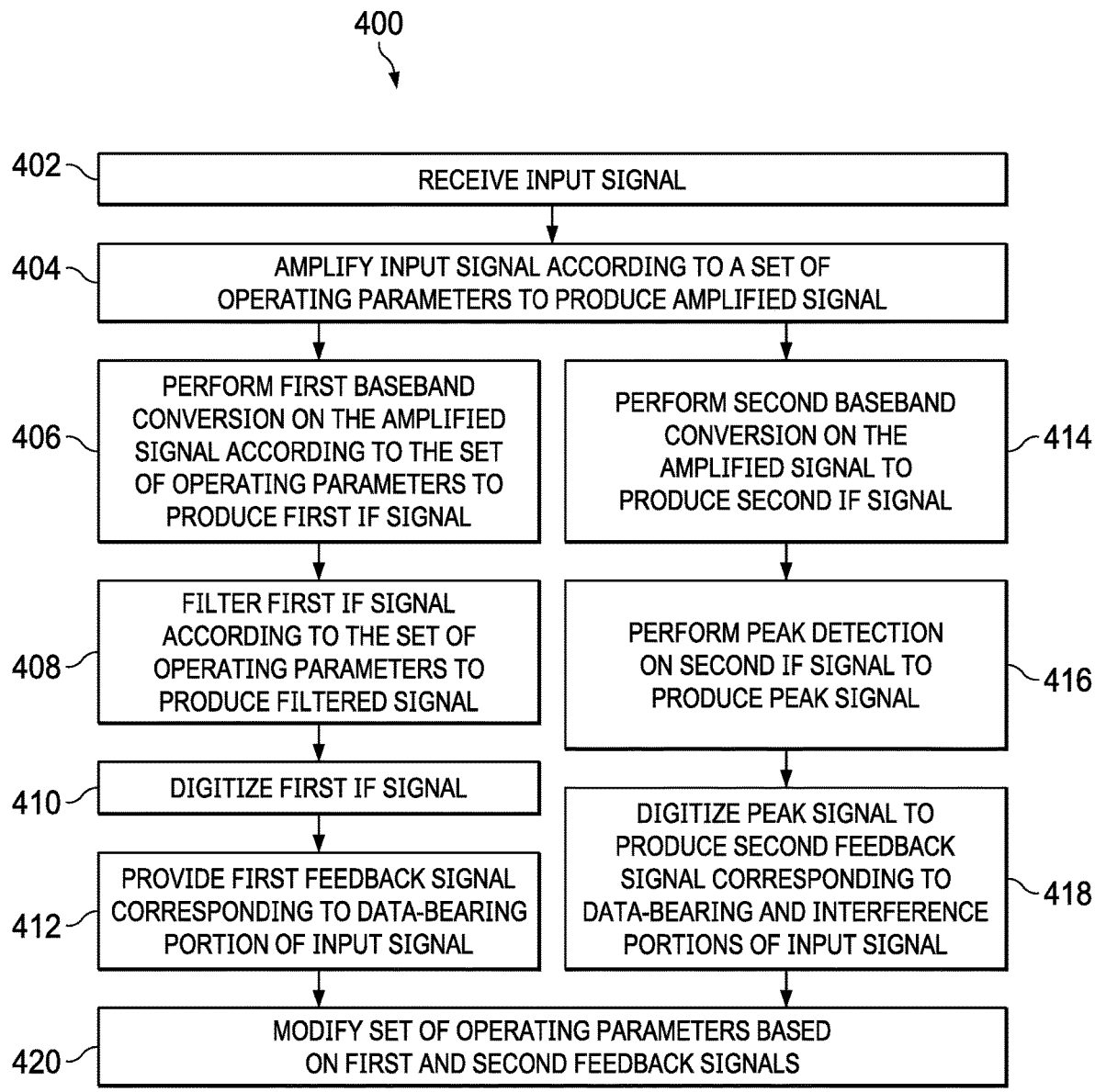
FIG. 4 is a flow diagram of a method of performing gain control in a receiver chain according to some aspects of the present disclosure.

Operation of the receiver is further described with reference to FIGS. 1A and 4. FIG. 4 is a flow diagram of a method 400 of performing gain control in a receiver chain according to some aspects of the present disclosure. The method 400 is suitable for performing by the receiver chain 100 of FIGS. 1A-3 or other suitable integrated circuit. Processes of the method 400 may be performed in orders other than described, and processes may be performed concurrently in parallel. Furthermore, processes of the method 400 may be omitted or substituted in some examples of the present disclosure.

Referring to block 402, the receiver chain 100 receives an input signal 102A. The input signal 102A may be received via an antenna 104, a photodiode, another receiver element, direct electrical connection, and/or any other suitable receiving mechanism.

Referring to block 404, an amplifier stage 106 of the receiver chain 100 receives the input signal 102A, amplifies the input signal 102A according to a set of operating parameters, and provides it as an amplified signal 102B.

Referring to block 406, a first mixer stage 116 of the receiver chain 100 receives the amplified signal 102B and performs a baseband conversion to convert the amplified signal 102B into a first intermediate frequency signal 102C. Parameters of the baseband conversion such as the gain and/or frequency response may be determined by the set of operating parameters.

Referring to block 408, a filter stage 120 of the receiver chain 100 filters the first intermediate frequency signal 102C to remove interference while preserving a data-bearing portion of the signal, which is provided as a filtered signal 102D. The frequency response and/or other operating parameters of the filter stage 120 may be determined by the set of operating parameters.

Referring to block 410, a first ADC stage 122 of the receiver chain 100 receives the filtered signal 102D and digitizes the signal to produce a digital output signal 102E. Referring to block 412, the first ADC stage 122 also provides a first feedback signal 124 to an AGC circuit 108. The first feedback signal 124 corresponds to a signal strength of a data-bearing portion of the received input signal 102A.

Referring to block 414, a second mixer stage 126 of the receiver chain 100 also receives the amplified signal 102B and performs a baseband conversion to convert the amplified signal 102B into a second intermediate frequency signal 102F. Additionally or in the alternative, the second mixer stage receives the input signal 102A directly and performs a baseband conversion to convert the input signal 102A into the second intermediate frequency signal 102F. In either example, in contrast to the conversion of block 406 and/or the filtering of block 408, the conversion of block 414 may be configured to preserve interference in the second intermediate frequency signal 102F. Accordingly, the second intermediate frequency signal 102F may include interference components that are removed by the conversion of block 406 or the filtering of block 408. For example, the baseband conversion of block 414 may be performed using a mixer stage with greater bandwidth than that used in block 406. In some examples, the baseband conversion of block 414 includes applying a gain to the amplified signal 102B to increase the strength of the interference in the second intermediate frequency signal 102F.

Referring to block 416, a peak detector 128 receives the second intermediate frequency signal 102F and provides a peak signal 102G with a voltage corresponding to a peak of the second intermediate frequency signal 102F.

Referring to block 418, a second ADC stage 134 of the receiver chain 100 receives the peak signal 102G and digitizes the signal to produce a second feedback signal 136. The second feedback signal 136 corresponds to a signal strength of both the data-bearing portion of the received input signal 102A and one or more interference components of the received input signal 102A.

Referring to block 420, an AGC circuit 108 modifies the set of operating parameters of the receiver chain 100 based on the first feedback signal 124 and the second feedback signal 136. In some examples, this includes the AGC circuit 108 increasing gain of the receiver chain 100 when the first feedback signal 124 indicates that the signal strength of a data-bearing portion of the received input signal 102A up to a maximum gain determined based on the second feedback signal 136 to avoid signal saturation.

The receiver chain 100 or other integrated circuit device may perform the processes of the method 400 using any combination of dedicated hardware and instructions stored in a non-transitory medium. Accordingly, elements of the receiver chain 100, such as the AGC circuit 108, may include a processing resource coupled to a non-transitory computer-readable medium. The processing resource may include one or more microcontrollers, ASICs, CPUs, GPUs, and/or other processing resources configured to execute instructions stored on the medium. Examples of suitable non-transitory computer-readable media include one or more flash memory devices, battery-backed RAM, SSDs, HDDs, optical media, and/or other memory devices suitable for storing the instructions for the processing resource.

It is understood that the present disclosure provides a number of exemplary embodiments and that modification are possible to these embodiments. Such modifications are expressly within the scope of this disclosure. Furthermore, application of these teachings to other environments, applications, and/or purposes is consistent with and contemplated by the present disclosure.

What is claimed is:

1. A method comprising:
receiving an input signal;
processing the input signal with a first path having a first bandwidth to produce a first signal;
processing the input signal with a second path having a second bandwidth to produce a second signal, wherein the second bandwidth is wider than the first bandwidth;
controlling a gain of the first path based on the first signal; and
limiting the gain of the first path based on the second signal.

2. The method of claim 1, further comprising providing the first signal to an analog-to-digital converter (ADC), wherein controlling the gain of the first path based on the first signal comprises controlling the gain of the first path based on an output of the ADC.

3. The method of claim 1, further comprising providing the second signal to an analog-to-digital converter (ADC), wherein limiting the gain of the first path based on the second signal comprises limiting the gain of the first path based on an output of the ADC.

4. The method of claim 1, further comprising providing the second signal to a comparator, wherein limiting the gain of the first path based on the second signal comprises limiting the gain of the first path based on an output of the comparator.

5. The method of claim 1, wherein receiving the input signal comprises receiving the input signal via an antenna.

6. The method of claim 5, wherein the first path comprises an amplifier stage having an input coupled to the antenna and an output, and wherein the second path comprises an input coupled to an output of the amplifier stage.

7. The method of claim 1, wherein controlling the gain of the first path comprises increasing the gain of the first path when the first signal is indicative of a low signal strength, and decreasing the gain of the first path when the first signal is indicative of a high signal strength.

8. The method of claim 1, wherein the second signal includes a data-bearing component that is also included in the first signal, and an interfering component that the first signal lacks.

9. The method of claim 1, wherein the second path comprises a peak detector to produce the second signal.

10. The method of claim 9, wherein the second path comprises a mixer stage having an output coupled to an input of the peak detector.

11. The method of claim 1, wherein the first path comprises an amplifier stage having an output coupled to a mixer stage, the mixer stage having an output coupled to a filter stage, the filter stage producing the first signal.

12. The method of claim 11, further comprising controlling an operating parameter of the mixer stage based on the first signal.

13. The method of claim 11, further comprising controlling a frequency response curve of the filter stage based on the first signal.

14. A device comprising:
  an antenna terminal configured to receive an input signal;
  a first path having a first bandwidth, an input coupled to the antenna terminal, and an output configured to produce a first signal based on the input signal;
  a second path having a second bandwidth, an input coupled to the antenna terminal, and an output configured to produce a second signal based on the input signal, wherein the second bandwidth is wider than the first bandwidth; and
  a control circuit configured to increase a gain of the first path based on a signal strength indicated by the first signal up to a maximum gain determined based on the second signal.

15. The device of claim 14, wherein the first path comprises:
  an amplifier stage having an input coupled to the antenna terminal and an output;
  a mixer stage having an input coupled to the output of the amplifier stage and an output; and
  a filter stage having an input coupled to the output of the mixer stage, and an output configured to produce the first signal.

16. The device of claim 15, wherein the control circuit is configured to control operational parameters of the amplifier stage, the mixer stage, and the filter stage, based on the first signal.

17. The device of claim 15, wherein the input of the second path is coupled to the output of the amplifier stage.

18. The device of claim 15, further comprising an analog-to-digital converter (ADC) having an input coupled to the output of the filter stage, wherein the control circuit is configured to increase the gain of the first path based on an output of the ADC.

19. The device of claim 14, wherein the second path comprises a peak detector configured to produce the second signal.

20. The device of claim 14, wherein the second signal includes a data-bearing component that is also included in the first signal, and an interfering component that the first signal lacks.

* * * * *